United States Patent
Mochizuki et al.

(10) Patent No.: US 11,164,958 B2
(45) Date of Patent: Nov. 2, 2021

(54) NANOSHEET TRANSISTOR HAVING A STRAINED CHANNEL WITH STRAIN-PRESERVING MULTI-SEGMENTED SOURCE/DRAIN REGIONS

(71) Applicant: International Business Machines Corporation, Armonk, NY (US)

(72) Inventors: Shogo Mochizuki, Clifton Park, NY (US); Nicolas Loubet, Guilderland, NY (US); Zhenxing Bi, Dunn Loring, VA (US); Richard A. Conti, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/752,900

(22) Filed: Jan. 27, 2020

(65) Prior Publication Data
US 2021/0234020 A1    Jul. 29, 2021

(51) Int. Cl.
*H01L 29/66* (2006.01)
*H01L 29/417* (2006.01)
*H01L 29/786* (2006.01)

(52) U.S. Cl.
CPC .. *H01L 29/66545* (2013.01); *H01L 29/41733* (2013.01); *H01L 29/66742* (2013.01); *H01L 29/78618* (2013.01)

(58) Field of Classification Search
CPC ........ H01L 29/66545; H01L 29/41733; H01L 29/66742; H01L 29/78618
USPC ......................................................... 257/288
See application file for complete search history.

(56) References Cited

U.S. PATENT DOCUMENTS

| | | | |
|---|---|---|---|
| 9,711,414 B2 | 7/2017 | Hatcher et al. | |
| 9,905,672 B2 | 2/2018 | Wang et al. | |
| 10,008,583 B1 | 6/2018 | Rodder et al. | |
| 2017/0271514 A1* | 9/2017 | Kittl | H01L 21/32055 |
| 2018/0175194 A1 | 6/2018 | Roboh et al. | |
| 2019/0058036 A1 | 2/2019 | Smith et al. | |
| 2019/0058052 A1* | 2/2019 | Frougier | H01L 29/6653 |
| 2020/0266060 A1* | 8/2020 | Cheng | H01L 29/0653 |

* cited by examiner

*Primary Examiner* — Tong-Ho Kim
(74) *Attorney, Agent, or Firm* — Cantor Colburn LLP; Erik Johnson (57) ABSTRACT

Provided are embodiments of a method for forming a semiconductor device. The method includes forming a nanosheet stack on a substrate, wherein the nanosheet stack comprises channel layers and nanosheet layers, forming a sacrificial gate over the nanosheet stack, and forming trenches to expose sidewalls of the nanosheet stack. The method also includes forming source/drain (S/D) regions, where forming the S/D regions including forming first portions of the S/D regions on portions of the nano sheet stack, forming second portions of the S/D regions, wherein the first portions are different than the second portions, and replacing the sacrificial gate with a conductive gate material. Also provided are embodiments of a semiconductor device formed by the method described herein.

17 Claims, 11 Drawing Sheets

FIG. 10

NANOSHEET TRANSISTOR HAVING A STRAINED CHANNEL WITH STRAIN-PRESERVING MULTI-SEGMENTED SOURCE/DRAIN REGIONS

BACKGROUND

The present invention generally relates to semiconductor-based transistors and more specifically to methods and resulting structures for nanosheet transistors having strained channels with strain-preserving multi-segmented source/drain (S/D) regions.

In contemporary semiconductor device fabrication processes, a large number of semiconductor devices, such as n-type field effect transistors (NFETs) and p-type field effect transistors (PFETs), are fabricated on a single wafer. Non-planar transistor device architectures, such as nanosheet (or nanowire) transistors, can provide increased device density and increased performance over planar transistors. In a known nanosheet transistor architecture, a gate stack wraps around the full perimeter of multiple nanosheet channel regions for improved control of channel current flow. Several FET performance parameters can be improved by introducing strain to one or more of the materials in the FET architecture. In general, a material is "strained" when its atoms have been stretched or compressed outside of their normal inter-atomic distances.

SUMMARY

Embodiments of the present invention are directed to a method for creating stress in the channel of a nanosheet transistor. A non-limiting example of the method includes forming a nanosheet stack on a substrate, wherein the nanosheet stack comprises channel layers and nanosheet layers; forming a sacrificial gate over the nanosheet stack; and forming trenches to expose sidewalls of the nanosheet stack. The method includes forming source/drain (S/D) regions, wherein forming the S/D regions includes forming first portions of the S/D regions on portions of the nanosheet stack; forming second portions of the S/D regions, wherein the first portions are different than the second portions; and replacing the sacrificial gate with a conductive gate material.

Embodiments of the present invention are directed to a semiconductor device. The semiconductor device includes a nanosheet stack comprising channel layers and nanosheet layers; one or more source/drain (S/D) regions, wherein each of the S/D regions comprises a first portion and a second portion, wherein the first portion is different than the second portion; and a conductive gate formed over the nanosheet stack.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although this detailed description describes an exemplary gate all-around (GAA) nanosheet FET architecture having silicon channel nanosheets and silicon germanium sacrificial nanosheets, implementation of the teachings recited herein are not limited to the particular FET architecture described herein. Rather, embodiments of the present invention are capable of being implemented in conjunction with any other type of FET device now known or later developed, including, for example, GAA nanosheet FET architectures having silicon germanium channel nanosheets and silicon sacrificial nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For GAA nanosheet FETs with silicon (Si) channel, the sacrificial nanosheets are silicon germanium (SiGe). For GAA nanosheet FETs with SiGe channels, the sacrificial nanosheets are Si. Forming the GAA nanosheets from alternating layers of channel nanosheets formed from a first type of semiconductor material and sacrificial nanosheets formed from a second type of semiconductor material provides superior channel electrostatics control, which is necessary for continuously scaling gate lengths down to seven (7) nanometer technology and below.

For the sake of brevity, conventional techniques related to semiconductor device and integrated circuit (IC) fabrication may not be described in detail herein. Moreover, the various tasks and process steps described herein can be incorporated into a more comprehensive procedure or process having additional steps or functionality not described in detail herein. In the interest of brevity and because many steps in the manufacture of semiconductor devices and semiconductor-based ICs are well known, these steps will either be only mentioned briefly herein or will be omitted entirely without providing the well-known process details.

Turning now to an overview of technologies that are more specifically relevant to aspects of the invention, transistors are semiconductor devices commonly found in a wide variety of ICs. A transistor is essentially a switch. When a voltage is applied to a gate of the transistor that is greater than a threshold voltage, the switch is turned on, and the current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field-effect transistors (MOSFETs), each MOSFET has a source and a drain that are formed in an active region of a semiconductor layer by incorporation of n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal-oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets.

It is desirable to introduce strain to the channel region of an FET. For example, introducing a compressive strain (typically expressed as a percentage) into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response.

Although the use of multiple layered SiGe/Si sacrificial/channel nanosheets (or Si/SiGe sacrificial/channel nanosheets) to form the channel regions in GAA FET semiconductor devices can introduce some degree of strain at the interface between SiGe nanosheets and Si nanosheets, it is currently difficult to introduce enough strain in the channel regions of a GAA FET semiconductor device to have a meaningful positive impact on transistor performance characteristics such as carrier mobility, switching speed, energy consumption, and the like. For example, in advanced transistors, it is difficult to obtain strain in the channel due to the limited area available in the device. In scenarios where the strain is induced in the channel, subsequent processing of the transistor relaxes the desired strain in the channel region.

Turning now to an overview of the aspects of the invention, one or more embodiments of the invention address the above-described shortcomings of the prior art by providing a nanosheet transistor having strained channels with strain-preserving multi-segmented source/drain (S/D) regions. In embodiments of the invention, a first nanosheet stack is formed adjacent a second nanosheet stack on a substrate. The first nanosheet stack includes a first channel nanosheet formed from a first type of semiconductor material, and the second nanosheet stack includes a second channel nanosheet formed from the first type of semiconductor material. A first doped S/D region is formed at an end of the first channel nanosheet, and a second doped S/D region is formed at an end of the second channel nanosheet until the first and second doped S/D regions are slightly merged, thereby forming a merged doped S/D region. In aspects of the invention, the merged doped S/D region includes substantially the same type of semiconductor material as the first and second channel regions. In accordance with aspects of the invention, the merged doped S/D region functions as a template for forming a third doped S/D region thereon. In accordance with aspects of the invention, the third doped S/D region includes a second type of semiconductor material that is different from the first type of semiconductor material. In accordance with aspects of the invention, the merged doped S/D region and the third doped S/D region introduces and maintains strain in the first and second channel nanosheets by not allowing the strain in the channel to be relaxed during the formation of the nano sheet transistor.

The mobility of electrons can be increased or decreased by modifying the stress in the semiconducting material (channel layer) in which they transit. Similarly, the mobility of holes can be increased or decreased by modifying the stress in the semiconductor material. When applying strain in the channel layer volume modification is favorable for PFET to increase the hole mobility within the device, and a volume modification is favorable for NFET to increase the electron mobility within the device.

The techniques described herein implement a dual layer S/D region which is advantageous over previous techniques (intrinsic stressed layers) because the structure of the dual layer S/D regions can induce a significant amount of strain on the channel layer of the nanosheet stack. The choice of materials for the first and second portions of the S/D regions must also to be compatible with microelectronics integrations.

Figure 1:
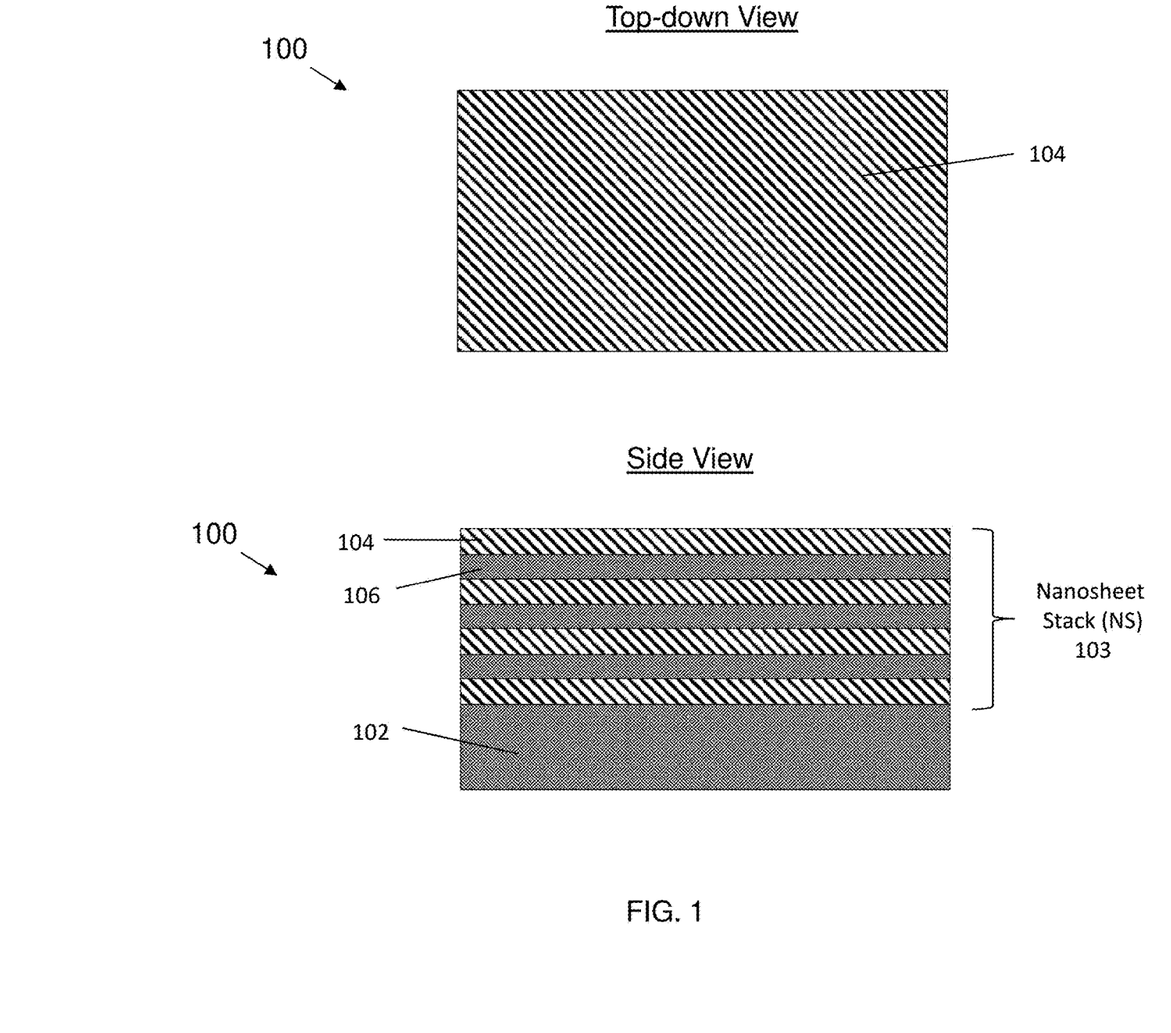
FIG. 1 depicts a top-down view and a side-view of a structure having semiconductor layers formed on a substrate during an intermediate operation of a method of fabricating a semiconductor device according to one or more embodiments of the present invention.
Figure 2:
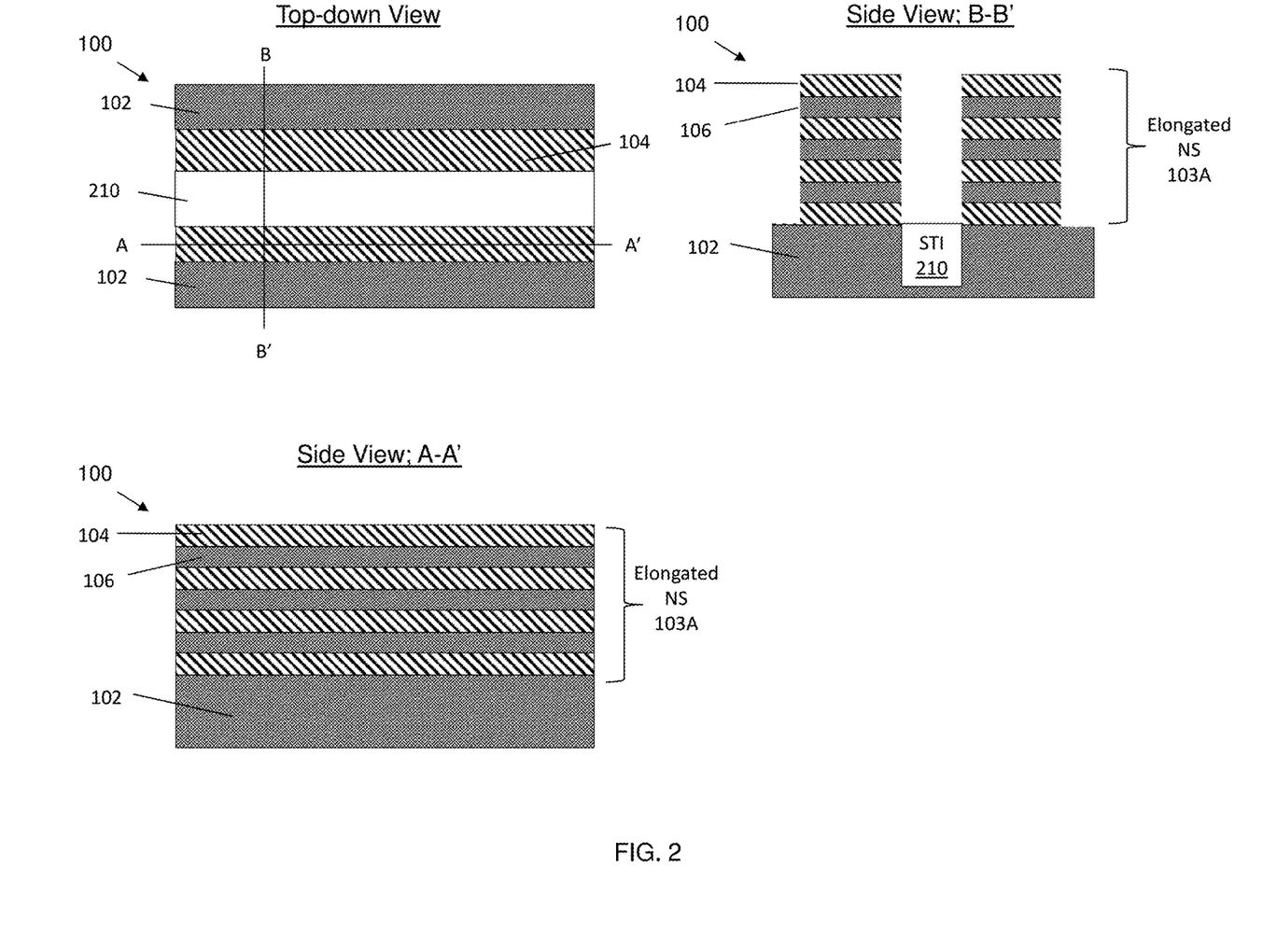
FIG. 2 depicts a top-down view, first cross-sectional side-view, and a second cross-sectional side-view of a semiconductor structure after a processing operation according to one or more embodiments of the invention.

Turning now to a more detailed description of aspects of the present invention, FIG. 1 depicts a cross-sectional view, taken along the line A-A' of FIG. 2, of a structure 100 and a cross-sectional view of the structure 100 taken along the line B-B' of FIG. 2 having a stack of alternating sacrificial nanosheet layers 104 and channel nanosheet layers 106 formed on a substrate 102 during an intermediate operation of a method of fabricating a semiconductor device according to one or more embodiments of the invention.

The substrate 102 can be made of any suitable substrate material, such as, for example, monocrystalline Si, SiGe, SiC, III-V compound semiconductor, II-VI compound semiconductor, or semiconductor-on-insulator (SOI). In some embodiments of the invention, the substrate 102 includes a buried oxide layer (not depicted). In some embodiments of the invention, the substrate 102 includes both an NFET Region and a PFET Region. In some embodiments of the invention, the substrate 102 includes either an NFET Region or a PFET Region.

In some embodiments of the invention, the sacrificial nanosheet layers 104 can be Si or SiGe. In embodiments of the invention where the channel nanosheet layers 106 are Si FET nanosheets, the sacrificial nanosheet layers 104 are SiGe sacrificial nanosheet layers. In some embodiments of the invention, the sacrificial nanosheet layers 104 have a thickness of about 4 nm to about 15 nm, although other thicknesses are within the contemplated scope of the invention. In some embodiments of the invention, the sacrificial nanosheet layers 104 can have a thickness of about 10 nm.

The channel nanosheet layers 106 can be made of any suitable material such as, for example, monocrystalline Si or silicon germanium (SiGe). In some embodiments of the invention, the channel nanosheet layers 106 are NFET nanosheets. In some embodiments of the invention, the NFET nanosheets are Si NFET nanosheets. In some embodiments of the invention, the channel nanosheet layers 106 have a thickness of about 4 nm to about 10 nm, although other thicknesses are within the contemplated scope of the invention. In some embodiments of the invention, the channel nanosheet layers 106 and the sacrificial nanosheet layers 104 are epitaxially grown films.

For ease of discussion, reference is made to operations performed on and to nanosheet stacks having three channel nanosheets 106 alternating with three sacrificial nanosheet layers 104 forming the nanosheet stack 103. It is understood, however, that the nanosheet stack can include any number of channel nanosheets 106 alternating with a corresponding number of sacrificial nanosheet layers 104. For example, the nanosheet stack can include a single channel nanosheet, two channel nanosheets, five channel nanosheets, eight channel nanosheets, or any number of channel nanosheets, along with a corresponding number of sacrificial layers (i.e., as appropriate to form a nanosheet stack having a bottommost sacrificial layer under a bottommost nanosheet and a sacrificial layer between each pair of adjacent nanosheets). In some embodiments of the invention, a topmost sacrificial layer is formed on a topmost nanosheet.

FIG. 2 depicts a top-down view of a structure 100 showing the substrate 102 and the nanosheet layers 104. In addition, a side-view of the structure 100, taken along the line A-A' of the top-down view is shown. Also, a side-view of the structure 100, taken along the line B-B' of the top-down view of FIG. 2 is shown. In some embodiments of the invention, portions of the substrate 102 are removed to expose a surface of the substrate 102 and a shallow trench isolation (STI) 210 can formed on the exposed surface. For example, the side view; B-B' shows the STI 210 that was formed between a first elongated nanosheet stack and a second elongated nanosheet stack 103A. The STI 210 prevents electrical current leak between adjacent semiconductor device components. Any known composition and manner of forming the STI 210 can be utilized. The STI 210 can be made of any suitable material, such as, for example, a silicon oxide. In some embodiments of the invention, the STI 210 is etched via an etch back process after a CMP process.

Figure 3:
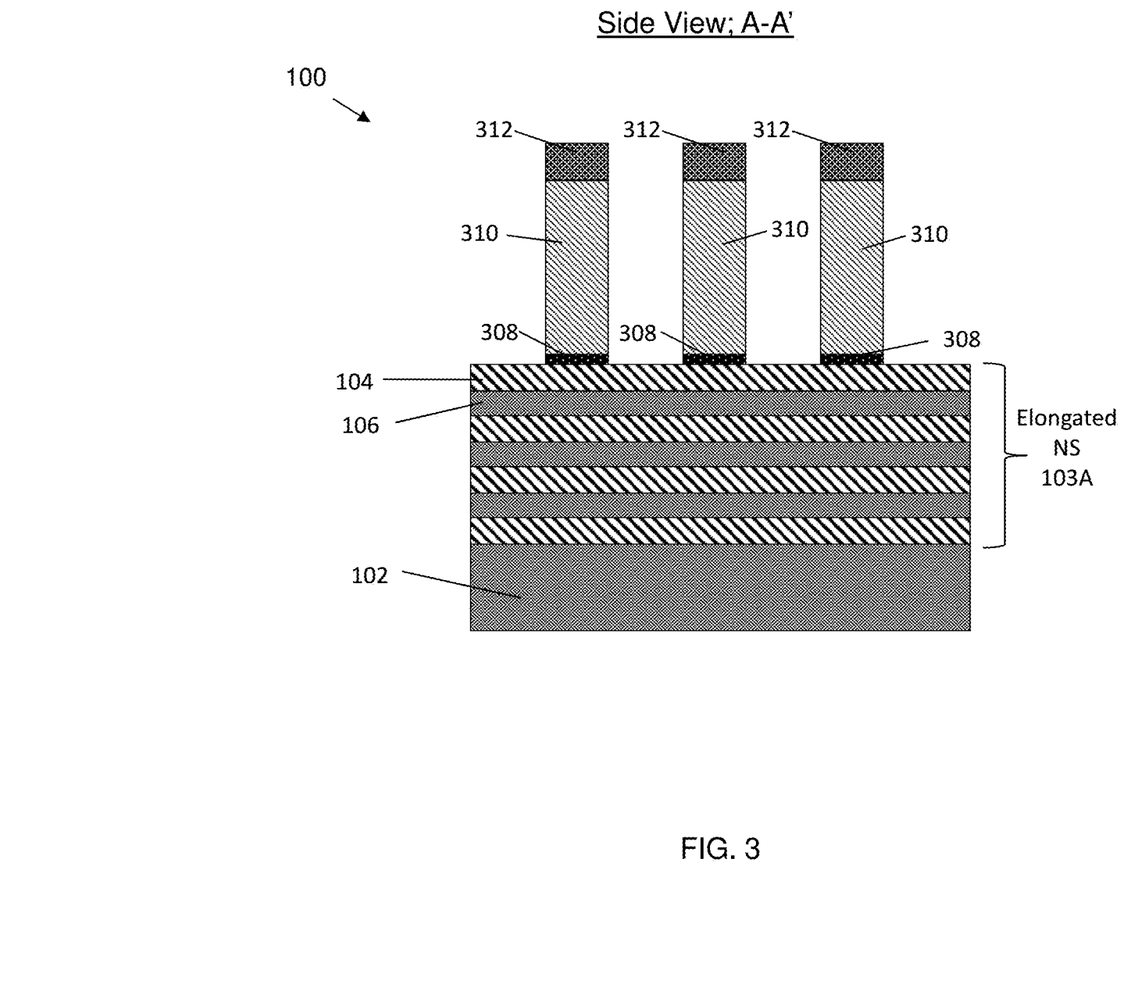
FIG. 3 depicts a cross-sectional side-view of a semiconductor structure after a processing operation according to one or more embodiments of the invention.

FIG. 3 illustrates a cross-sectional view, taken along line A-A of FIG. 2, of the structure 100 after forming a sacrificial gate 310 over and around the nanosheet stacks during an intermediate operation of a method of fabricating a semiconductor device according to one or more embodiments of the invention. In some embodiments of the invention, a spacer layer 308 is formed prior to forming the sacrificial gates 310. The sacrificial gates 310 can be made of any suitable material, such as, for example, amorphous silicon or polysilicon. Any known method for patterning a sacrificial gate 310 (also known as a dummy gate) can be used, such as, for example, a wet etch, a dry etch, or a combination of sequential wet and/or dry etches. In some embodiments of the invention, a layer of amorphous silicon is deposited over the nanosheet stack, and a hard mask layer is deposited over the amorphous silicon. The hard mask layer is patterned and etched to form the hard masks 312 and the sacrificial gates 310. In some embodiments of the invention, the hard masks 312 are formed by patterning and etching the hard mask layer, and a wet or dry etch process is applied to selectively remove portions of the amorphous silicon that are not covered by the hard masks 312. The hard masks 312 can be made of any suitable material, such as, for example, a silicon nitride. In some embodiments of the invention, second hard masks (not depicted) are formed on the hard masks to form a bilayer hard mask. In some embodiments of the invention, the second hard masks include an oxide, such as, for example, silicon dioxide.

Any known manner of patterning can be used, such as, for example, a sidewall image transfer (SIT) operation, a wet etch process, or a dry etch process. In some embodiments of the invention, the nanosheets are patterned using a patterned hard mask and directional RIE.

Figure 4:
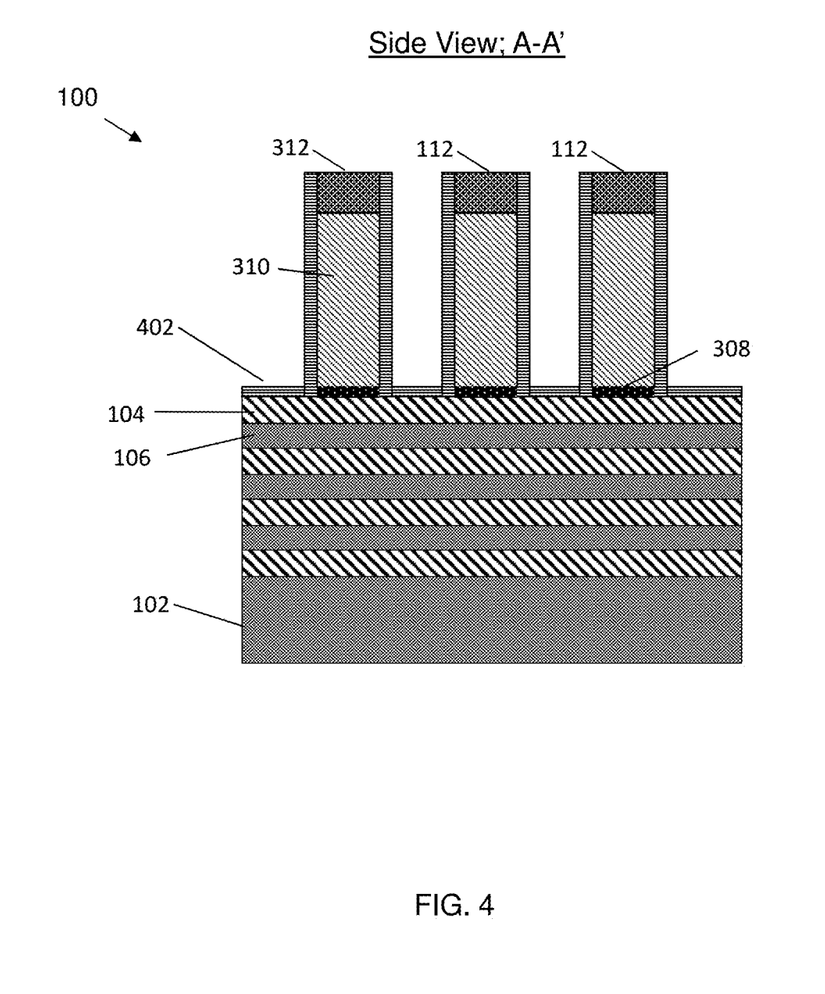
FIG. 4 depicts a cross-sectional side-view of a semiconductor structure after a processing operation according to one or more embodiments of the invention.

FIG. 4 illustrates a cross-sectional view, taken along line A-A' of FIG. 2, of the structure 100 after patterning the nanosheet stack (shown in FIG. 2) to form a spacer layer 402 (also known as sidewall spacers) over the structure 100. In particular, the spacer layer 402 is formed over the top sacrificial nanosheet layer 104 and the sidewalls of the sacrificial gate 310 and hard mask 312 during an intermediate operation of a method of fabricating a semiconductor device according to one or more embodiments of the invention. In some embodiments of the invention, the spacer layer 402 is formed using a CVD, PECVD, ALD, PVD, chemical solution deposition, or other like processes in combination with a wet or dry etch process. The spacer layer 402 can be made of any suitable material, such as, for example, a low-k dielectric, a nitride, silicon nitride, silicon dioxide, SiON, SiC, SiOCN, or SiBCN.

Figure 5:
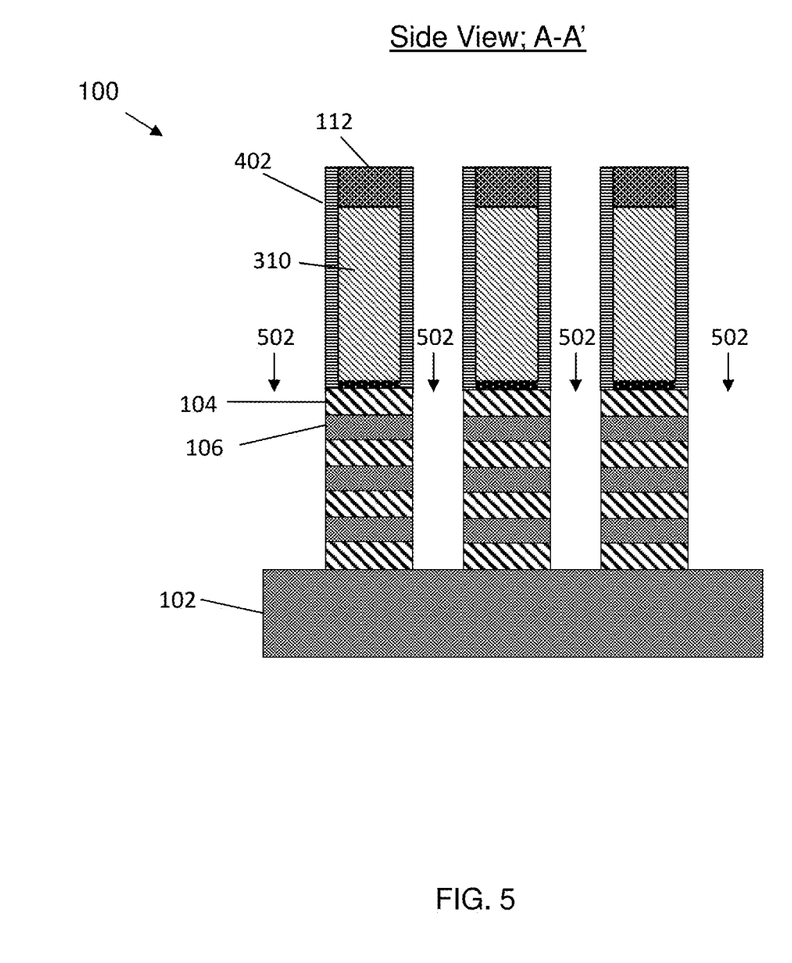
FIG. 5 depicts a cross-sectional side-view of a semiconductor structure after a processing operation according to one or more embodiments of the invention.

FIG. 5 illustrates a cross-sectional view, taken along line A-A' of FIG. 2, of the structure 100 after performing an etch process. In some embodiments of the invention, portions 502 of the nanosheet stack (i.e., nanosheets) are removed to expose a surface of the substrate 102. Any known method for patterning nanosheet stacks can be used, such as, for example, a wet etch, a dry etch, or a combination of sequential wet and/or dry etches. In some embodiments of the invention, a directional dry etch selective to the spacer layer 402 is used. In this manner, opposite ends of the nanosheet stacks extend to opposite edges of the spacer layer 402.

Figure 6:
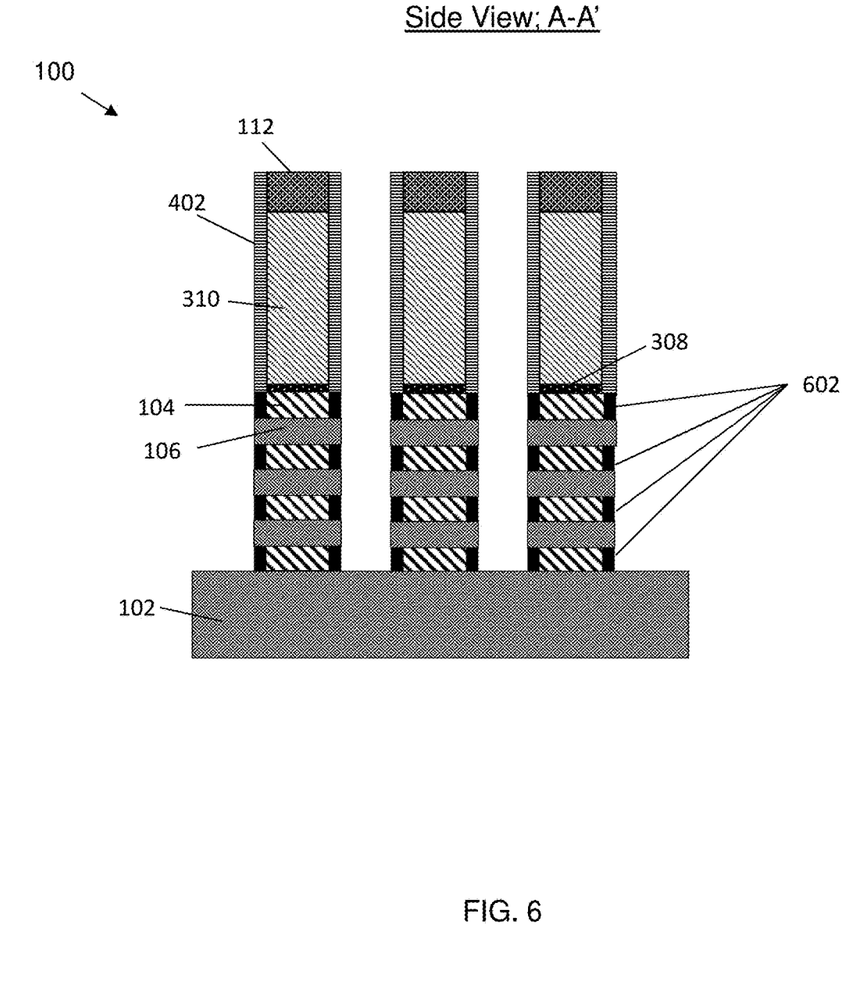
FIG. 6 depicts a cross-sectional side-view of a semiconductor structure after a processing operation according to one or more embodiments of the invention.

FIG. 6 illustrates a cross-sectional view, taken along line A-A' of FIG. 2, of the structure 100 after performing a selective etch process on the sidewalls of the nanosheet stack in accordance with one or more embodiments of the invention. In addition, FIG. 6 also illustrates a cross-sectional view of the structure 100 after forming the inner spacers 602 on the sidewalls of the nanosheet stacks where the inner spacers 602 are shown contacting the sacrificial nanosheet layers 104. In one or more embodiments, the inner spacers 602 are formed by selectively etching the nanosheet layers 104 and depositing a layer such as a nitride layer over the nanosheet layers 104. After the formation of the inner spacers 602, an etch back process can be performed to smooth the surface of the inner spacers 602 for further processing. It should be understood that other materials and processes can be used to form the inner spacers 602.

Figure 7:
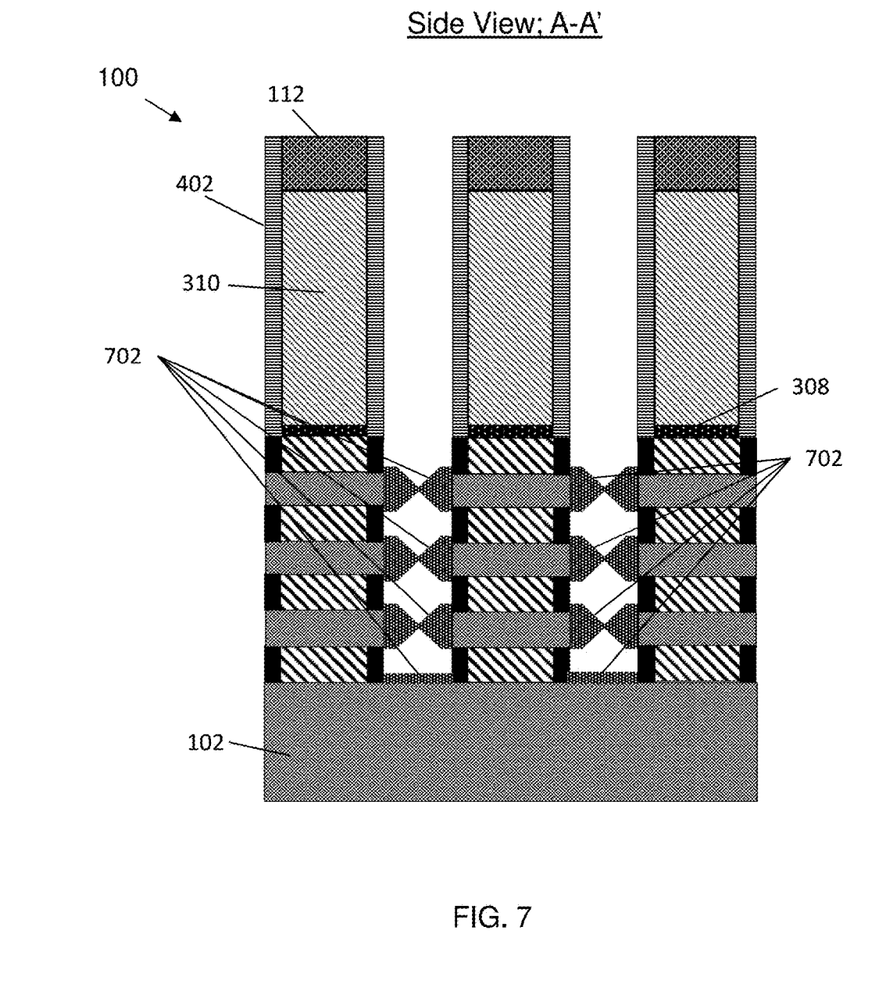
FIG. 7 depicts a cross-sectional side-view of a semiconductor structure after a processing operation according to one or more embodiments of the invention.

FIG. 7 illustrates a cross-sectional view, taken along line A-A' of FIG. 2, of the structure 100 after forming first portions 702 of the source/drain (S/D) region. The first portions 702 of the S/D region is formed by selectively growing the first portions 702 on the exposed channel nanosheet layers 106 on the sidewalls of the nanosheet stack in accordance with one or more embodiments of the invention. This can be referred to as a first epitaxial growth process. In one or more embodiments of the invention, the material (first material) of the first portions 702 is boron doped silicon (Si:B).

Also, in embodiments of the invention, the first portions 702 of the S/D regions are grown until it contacts first portions 702 of an adjacent nanosheet stack as shown in FIG. 7. However, this is a non-limiting example and is not intended to limit the scope of the semiconductor device. The shape of the first portions 702 of the S/D regions depicts a pyramid-like structure or diamond-shaped structure extending from the exposed portions channel layers of the nanosheet stacks. During the growing processing, the neighboring S/D regions become merged with the S/D regions of the first nanosheet stack and thus fixing the strain that was generating during the modification of the sacrificial gate 310 described above. In one or more embodiments, the first portions 702 of the S/D regions has the same or similar lattice constant material as the channel material which does not induce extra strain into the channel region so that it would act as a template to prevent the elastic strain relaxation of the stressor (the second portion of the S/D regions (discussed below)). For example, doped Si first portions for a Si channel, doped $Si_{1-x}Ge_x$ first portions for a $Si_{1-x}Ge_x$ channel, etc.

Figure 8A:
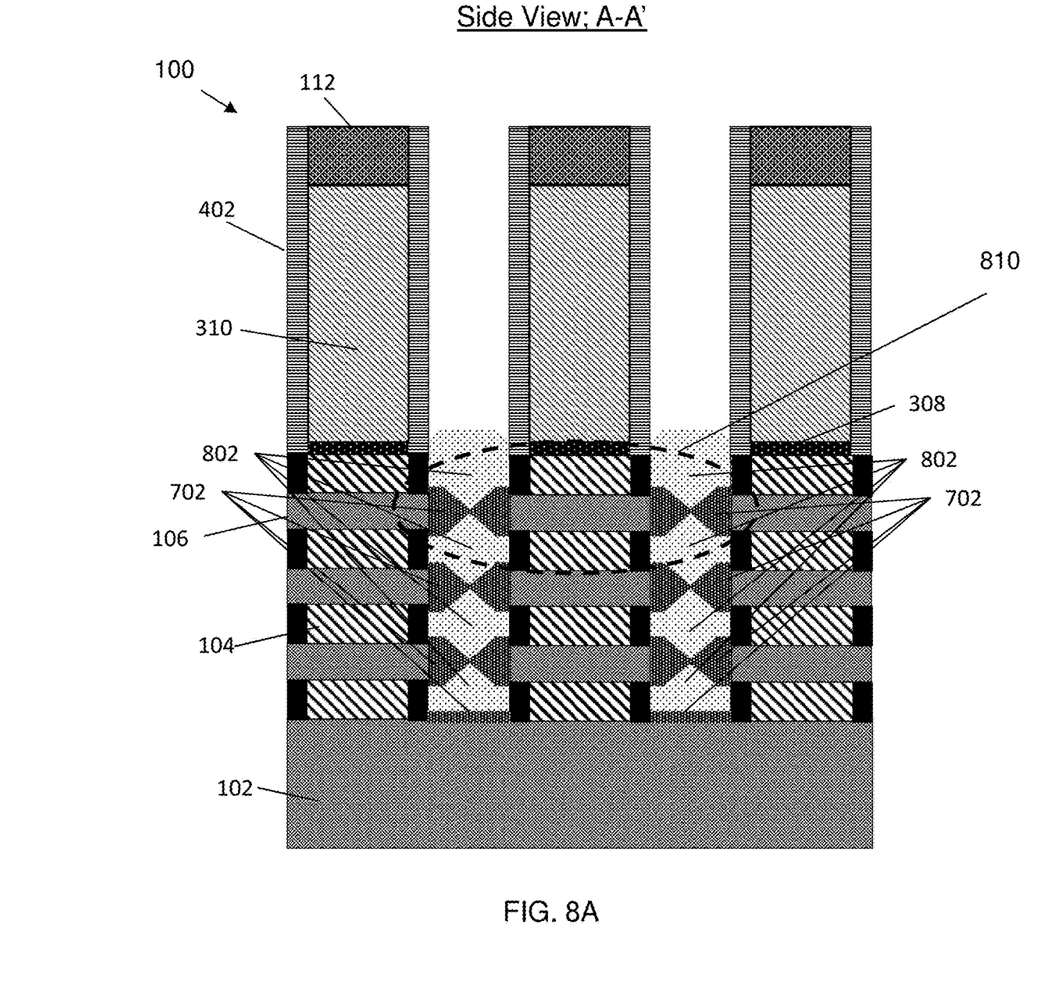
FIG. 8A depicts a cross-sectional side-view of a semiconductor structure after a processing operation according to one or more embodiments of the invention.

FIG. 8A illustrates a cross-sectional view, taken along line A-A' of FIG. 2, of the structure 100 after forming a second portion 802 of the S/D region. A second epitaxial growth process can be performed to form the second portion 802 of the S/D region. In one or more embodiments of the invention, the material (second material) for the second portion 802 of the S/D region is boron doped silicon germanium (SiGe:B). The second portion 802 fills in the trenches 502 between the nanosheet stacks. The second portion 802 is also coupled to the first portions 702 of the S/D region. In one or more embodiments, the second portion 802 of the S/D regions have a different lattice constant material than the lattice constant of the first portions 702 of the S/D regions and the channel region so it acts as a stressor. For example, a doped SiGe for the structure with the first portions 702 of the S/D region with doped Si and Si channel (compressive strained channel); a doped $Si_{1-y}Ge_y$ for the structure with the first portions 702 of the S/D with doped $Si_{1-x}Ge_x$ and $Si_{1-x}Ge_x$ channel (y>x for compressive strained channel); doped Si:C for the structure with the first portions 702 of the S/D with doped Si and Si channel (tensile strained channel); doped $Si_{1-y}Ge_y$ or Si:C for the structure with the first portions 702 of the S/D with doped $Si_{1-x}Ge_x$ and $Si_{1-x}Ge_x$ channel (y<x for tensile strained channel); etc.

In one or more embodiments of the invention, doped regions can be formed on opposite ends of the nanosheet stacks. Specifically, the doped regions can be formed on a sidewall of the nanosheet stack adjacent to a first neighboring nanosheet stack and on an opposite sidewall of the nanosheet stack adjacent to a second neighboring nanosheet stack. The doped regions can be source or drain regions formed in the substrate 102 by a variety of methods, such as, for example, in-situ doped epitaxy, doped following the epitaxy, or by implantation and plasma doping. In some embodiments of the invention, the doped regions are complementary, such that one of the doped regions is a source while the other is a drain. In embodiments of the invention having both NFET and PFET regions the doped regions are n-type doped regions and the doped regions are p-type doped regions. The doped regions can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments of the invention, doped regions include epitaxial semiconductor materials grown from gaseous or liquid precursors. In some embodiments of the invention, epitaxial regions are epitaxially grown over the substrate 102. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the invention, the doped regions include silicon. In some embodiments of the invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 8B:
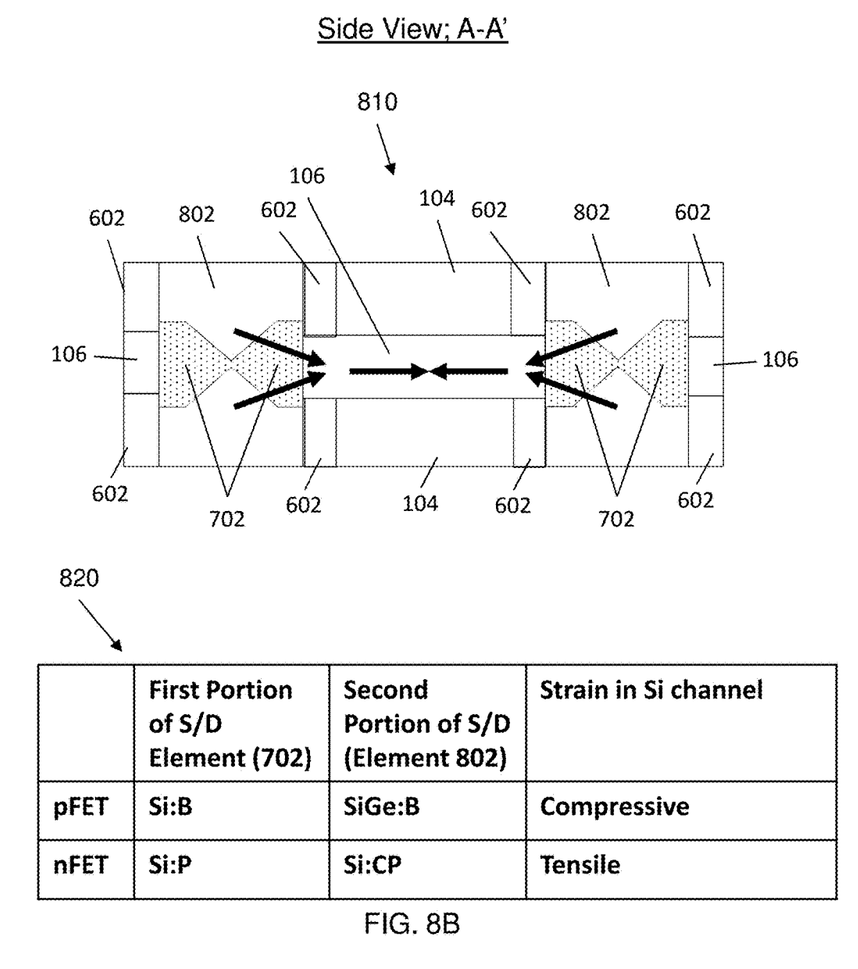
FIG. 8B depicts a cross-sectional side-view of a semiconductor structure after a processing operation according to one or more embodiments of the invention.

FIG. 8A also depicts the compressively strained channel 106 in the dashed area 810. The side view shown in FIG. 8B depicts a view of the compressively strained channel 106. The arrows → provide a representation of the strain induced in the channel 106 of the structure 100. FIG. 8B also provides a table 820 illustrating non-limiting examples of the materials used to induce the tensile and compressive strain in the channel 106. In a scenario of a PFET where the compressive strain is increased, the S/D material for the first portions 702 is boron doped silicon (Si:B) and the second portion 802 is boron doped silicon germanium (SiGe:B). In a scenario for an NFET where the tensile strain is increased, the S/D material for the first portions 702 is phosphorous doped silicon (Si:P) and the second portion 802 is carbon phosphorous doped silicon (Si:CP).

Figure 9:
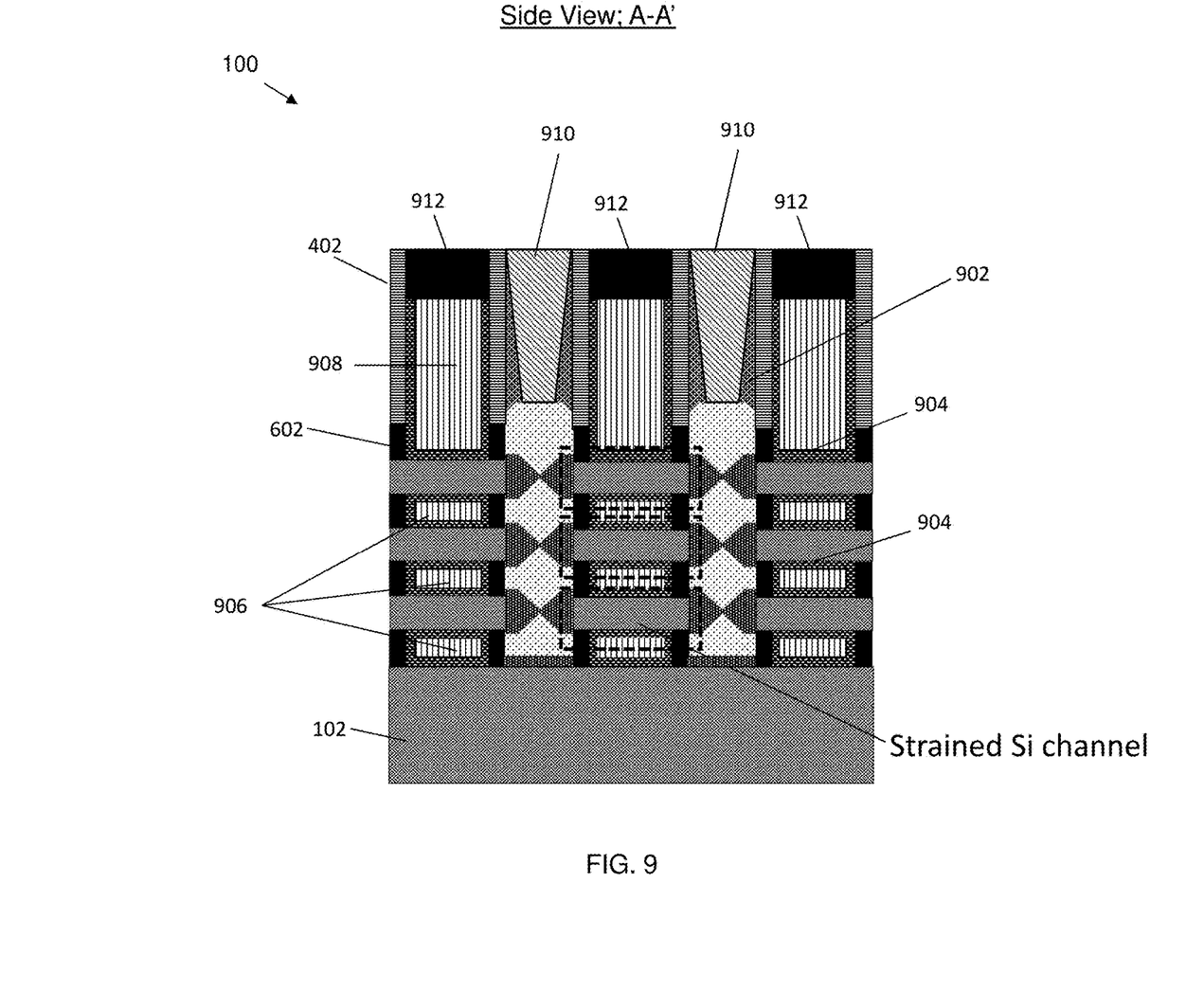
FIG. 9 depicts a cross-sectional side-view of a semiconductor structure after a processing operation according to one or more embodiments of the invention.

FIG. 9 illustrates a cross-sectional view, taken along line A-A' of FIG. 2, of the structure 100 after completing the formation of the structure 100 using operations of a method of fabricating the semiconductor device according to one or more embodiments of the invention. FIG. 9 illustrates a cross-sectional view of the structure 100 after removing the sacrificial gates 310 during an intermediate operation of a method of fabricating a semiconductor device according to one or more embodiments. Any known method for removing the sacrificial gates 310 can be used, such as, for example, a wet etch, a dry etch, or a combination of sequential wet and/or dry etches.

FIG. 9 also illustrates a cross-sectional view of the structure 100 after removing the sacrificial nanosheet layers 104 during an intermediate operation of a method of fabricating a semiconductor device according to one or more embodiments of the invention. As previously described herein, the sacrificial nanosheet layers 104 are removable using the same etchant (i.e., concurrently during the same wet or dry etch). Any suitable known removal process can be utilized. In some embodiments of the invention, the sacrificial nanosheet layers 104 are removed using a wet or dry etch process selective to the nanosheets. In some embodiments of the invention, an HCl etch is used to remove the sacrificial nanosheet layers 104. In some embodiments of the invention, the HCl etch is a highly SiGe selective vapor phase etch at a temperature of about 300 to about 700 degrees Celsius. In some embodiments of the invention, tetramethylammnoium hydroxide (TMAH), tetraethylammnoium hydroxide (TEAH), or ammonium hydroxide (NH$_4$OH) can be used to selectively remove the sacrificial nanosheet layers 104.

In one or more embodiments of the invention, a thick dielectric layer can be formed over channel regions of the nanosheet stacks during an intermediate operation of a method of fabricating a semiconductor device. The thick dielectric layer can be formed using, for example, CVD, PECVD, ALD, flowable CVD, spin-on dielectrics, or PVD. In some embodiments of the invention, the thick dielectric layer is conformally formed using ALD to a thickness of about 0.5 nm to about 5 nm, although other thicknesses are within the contemplated scope of the invention.

FIG. 9 further illustrates a cross-sectional view of the structure 100 after forming conductive gates 908 to wrap around channel layers of the nanosheet stacks during an intermediate operation of a method of fabricating a semiconductor device according to one or more embodiments of the invention. The conductive gates 908 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the conductive gates 908 are planarized to a top surface of the spacers, using, for example, a CMP operation.

In some embodiments of the invention, a high-k dielectric 904 is formed between each of the conductive gates 908 the channel nanosheet layers 106 of the nanosheet stacks. In some embodiments of the invention, the high-k dielectric modifies the work function of each respective gate. The high-k dielectrics can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectrics can have a thickness of about 0.5 nm to about 4 nm. In some embodiments, the high-k dielectrics can have a thickness of about 2 nm to about 3 nm, although other thicknesses are within the contemplated scope of the invention.

In some embodiments of the invention, work function layers (not depicted) are formed between each of the high-k dielectrics and the conductive gates 908. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments of the invention, the work function layers further modify the work function of each respective gate.

FIG. 9 illustrates a cross-sectional view of the structure 100 after forming contacts 910 in the ILD 902 during an intermediate operation of a method of fabricating a semiconductor device according to one or more embodiment of the invention. The contacts 910 can be formed using known metallization techniques. In some embodiments of the invention, the ILD 902 is extended with additional material, patterned with open trenches, and the contacts 910 are deposited into the trenches. In some embodiments of the invention, the contacts 910 are overfilled into the trenches, forming overburdens above a surface of the ILD 902. In some embodiments of the invention, a CMP selective to the ILD 902 removes the overburden. The ILD 902 can be made of any suitable material, such as, for example, porous silicates, carbon doped oxides, silicon dioxides, silicon nitrides, silicon oxynitrides, or other dielectric materials. Any known manner of forming the ILD 902 can be utilized. The ILD 902 can be formed using, for example, CVD, PECVD, ALD, flowable CVD, spin-on dielectrics, or PVD. In some embodiments of the invention, the ILD 902 is planarized to a top surface of the hard masks, using, for example, a CMP operation. In some embodiments of the invention, the ILD 902 includes a thin nitride cap layer (not depicted).

The contacts 910 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the contacts 910 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

Figure 10:
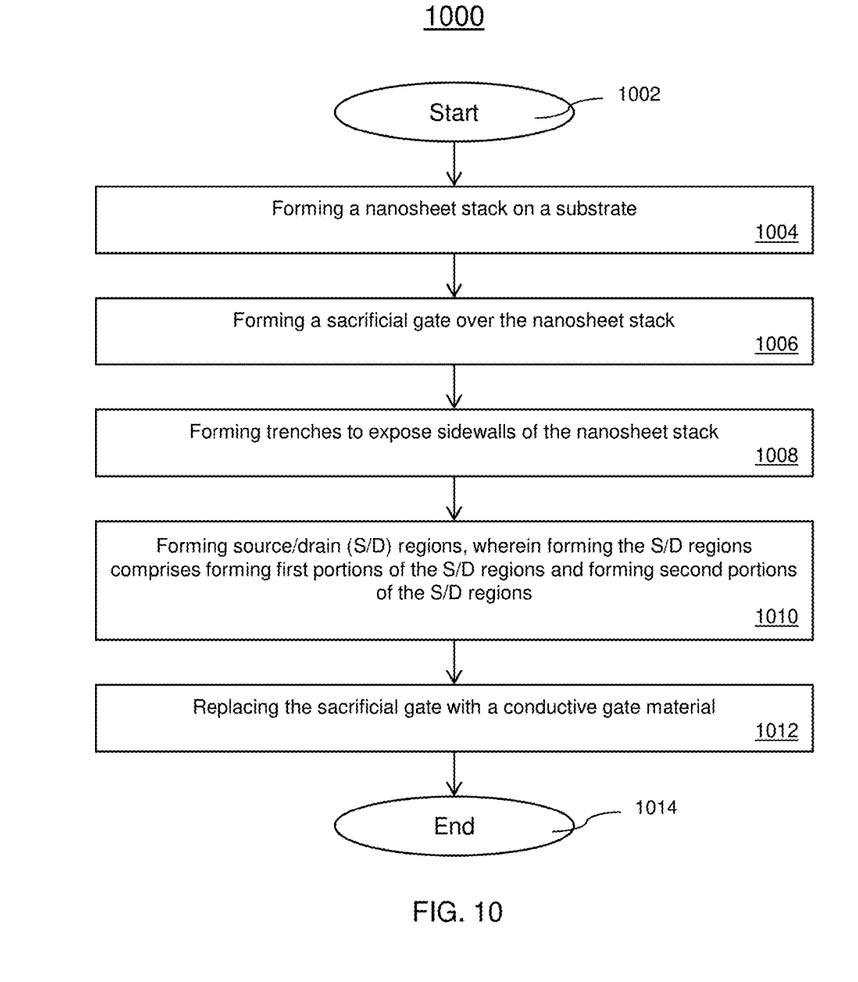
FIG. 10 depicts a flow diagram illustrating a method according to one or more embodiments of the invention.

FIG. 10 depicts a flowchart of a method 1000 for forming a semiconductor device according to one or more embodiments of the invention. The method 1000 begins at block 1002 and proceeds to block 1004 and forms a nanosheet stack on a substrate, wherein the nanosheet stack includes channel layers and nanosheet layers. Block 1006 forms a sacrificial gate over the nanosheet stack. At block 1008 trenches are formed to expose sidewalls of the nanosheet stack. Block 1010 forms source/drain (S/D) regions. In one or more embodiments of the invention, forming the S/D regions includes forming a first portions of the S/D regions on the channel layers of the nanosheet stack, and forming a second portion of the S/D regions. The first portions of the S/D region includes Si:B formed on the sidewalls of the channel layer and the second portion of the S/D region includes SiGe:B material form in the trench and on the Si:B of the channel layers, where the first portions and second portion of the S/D region maintain the strain in the channel layers.

The first portions of the S/D region is epitaxially grown in a first process and the second portion of the S/D region is epitaxially grown in a second process. At block 1012, the sacrificial gate is replaced with a conductive gate material. The method 1000 ends at block 1014. It should be understood that the method 1000 shown in FIG. 10 is not intended to limit the scope but provides a non-limiting example for one or more embodiments of the invention.

The techniques described herein maintain or increase the strength of the channel to enhance the mobility characteristics of the semiconductor device.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The phrase "direct contact" means that a first element, such as a first structure, and a second element, such as a second structure, are connected without any intermediary conducting, insulating or semiconductor layers at the interface of the two elements. It should be noted that the phrase "selective to," such as, for example, "a first element selective to a second element," means that a first element can be etched and the second element can act as an etch stop. The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a nanosheet stack on a substrate, wherein the nanosheet stack comprises channel layers and nanosheet layers;
    forming a sacrificial gate over the nanosheet stack;
    forming trenches to expose sidewalls of the nanosheet stack;
    forming source/drain (S/D) regions, wherein forming the S/D regions comprise:
        forming first portions of the S/D regions on portions of the nanosheet stack, wherein the first portions of the S/D regions include a first material, wherein a lattice constant of the first material is equal to a lattice constant of a material of the channel layers to prevent inducing extra strain into the channel region;
        forming second portions of the S/D regions, wherein the first portions are different than the second portions, wherein the second portions of the S/D region include a second material, wherein a lattice constant of the second material is different than the lattice constant of the first material and the lattice constant of the material of the channel layers; and
    replacing the sacrificial gate with a conductive gate material.

2. The method of claim 1, wherein the first portions of the S/D regions are formed on the channel layers of the nanosheet stack.

3. The method of claim 1, wherein the second portions of the S/D regions do not directly contact the channel layers of the nanosheet stack.

4. The method of claim 1 further comprising:
    responsive to forming trenches, forming indents of one or more layers of the nanosheet stack; and
    forming inner layer spacers within the indent of the one or more layers of the nanosheet stack.

5. The method of claim 4, wherein the second portions of the S/D regions contact the inner layer spacers.

6. The method of claim 1, wherein the first portions of the S/D regions are formed using a first selective epitaxial growth process.

7. The method of claim 6, wherein the first selective epitaxial growth process is stopped when the first portions formed on a first sidewall contact a first material of a second sidewall.

8. The method of claim 7, wherein the second portions of the S/D regions are formed using a second epitaxial growth process.

9. The method of claim 1 further comprising depositing a high-k/work function metal prior to replacing the sacrificial gate material.

10. The method of claim 1 further comprising forming contacts over the S/D regions, wherein the S/D regions contact the second portion of the S/D regions.

11. A semiconductor device comprising:
a nanosheet stack comprising channel layers and nanosheet layers;
one or more source/drain (S/D) regions, wherein each of the S/D regions comprises a first portion and a second portion, wherein the first portion is different than the second portion, wherein the first portion of the S/D regions includes a first material, wherein a lattice constant of the first material is equal to a lattice constant of a material of the channel layers,
wherein the second portion of the S/D regions includes a second material, wherein a lattice constant of the second material is different than the lattice constant of the first material and the lattice constant of the material of the channel layers; and
a conductive gate formed over the nanosheet stack.

12. The semiconductor device of claim 11, wherein the first portion of the S/D regions contacts the channel layers of the nanosheet stack.

13. The semiconductor device of claim 11, wherein the second portion of the S/D regions does not directly contact the channel layers of the nanosheet stack.

14. The semiconductor device of claim 11 further comprising inner layer spacers formed on one or more layers of the nanosheet stack.

15. The semiconductor device of claim 14, wherein the second portion of the S/D regions contacts the inner layer spacers.

16. The semiconductor device of claim 11 further comprising a high-k/work function metal deposited prior to the conductive gate.

17. The semiconductor device of claim 11 further comprising contacts formed over the S/D regions, wherein the S/D regions contact the second portion of the S/D regions.

* * * * *